United States Patent [19]

Pan

[11] Patent Number: 5,670,395
[45] Date of Patent: Sep. 23, 1997

[54] PROCESS FOR SELF-ALIGNED TWIN WELLS WITHOUT N-WELL AND P-WELL HEIGHT DIFFERENCE

[75] Inventor: Yang Pan, Singapore, Singapore

[73] Assignee: Chartered Semiconductor Manufacturing Pte. Ltd., Singapore, Singapore

[21] Appl. No.: 638,670

[22] Filed: Apr. 29, 1996

[51] Int. Cl.$^6$ ................................................. H01L 21/8238
[52] U.S. Cl. ........................ 437/34; 437/147; 437/228 PL
[58] Field of Search ................................. 437/34, 57, 70, 437/74, 147, 228 PL; 148/DIG. 70

[56] References Cited

U.S. PATENT DOCUMENTS

| | | | |
|---|---|---|---|
| 5,130,271 | 7/1992 | Migita | 437/147 |
| 5,252,501 | 10/1993 | Moslehi | 437/34 |
| 5,300,797 | 4/1994 | Bryant et al. | 257/206 |
| 5,429,958 | 7/1995 | Matlock | 437/34 |
| 5,438,005 | 8/1995 | Jang | 437/34 |
| 5,455,189 | 10/1995 | Grubisich | 437/34 |

*Primary Examiner*—Chandra Chaudhari
*Attorney, Agent, or Firm*—George O. Saile; Rosemary L. S. Pike

[57] ABSTRACT

A method for forming self-aligned twin wells without height difference using only one masking step is described. A layer of silicon oxide is grown over the surface of a semiconductor substrate. A layer of silicon nitride is deposited overlying the silicon oxide layer. A layer of photoresist is coated over the silicon nitride layer. The photoresist layer is exposed to actinic light and developed to form a photoresist mask having an opening to the silicon nitride layer where an N-well is to be formed. The silicon nitride layer which is exposed is etched away to expose the underlying silicon oxide layer. First ions are implanted into the semiconductor substrate through the silicon oxide layer within the opening. A dielectric film is deposited over the substrate. The dielectric film is planarized to the height of the silicon nitride layer. The silicon nitride layer is removed. Second ions are implanted into the semiconductor substrate where it is not covered by the dielectric film. The dielectric film is removed. The first ions are driven in to form the N-well within the semiconductor substrate and the second ions are driven in to form a P-well within the semiconductor substrate completing the formation of the twin wells in the fabrication of the integrated circuit device.

23 Claims, 4 Drawing Sheets

5,670,395

PROCESS FOR SELF-ALIGNED TWIN WELLS WITHOUT N-WELL AND P-WELL HEIGHT DIFFERENCE

BACKGROUND OF THE INVENTION (1) Field of the Invention

The invention relates to the fabrication of integrated circuit devices, and more particularly, to a method of forming self-aligned N- and P-wells without height difference in the fabrication of integrated circuits.

(2) Description of the Prior Art

The self-aligned twin well process has been widely used in the fabrication of integrated circuits. It is well known that the use of a thick thermally grown oxide to block the well implant introduces N- and P- well height differences. These height differences lead to difficulties in the photolithography processes because the focusing distances are different. This causes non-uniformity of the polysilicon dimension across the wafer.

U.S. Pat. Nos. 5,300,797 to Bryant et al and 5,455,189 to Grubisich disclose two-step masking processes to form N- and P- wells without height differences. U.S. Pat. No. 5,428,005 to Jang shows N- and P- wells without height difference, but does not describe how they are made.

SUMMARY OF THE INVENTION

A principal object of the present invention is to provide an effective and very manufacturable method of forming twin wells without height difference in the fabrication of an integrated circuit device.

A further object of the invention is to provide a method of forming twin wells without height difference using only one masking step.

In accordance with the objects of this invention a method for forming self-aligned twin wells without height difference using only one masking step is achieved. A layer of silicon oxide is grown over the surface of a semiconductor substrate. A layer of silicon nitride is deposited overlying the silicon oxide layer. A layer of photoresist is coated over the silicon nitride layer. The photoresist layer is exposed to actinic light and developed to form a photoresist mask having an opening to the silicon nitride layer where an N-well is to be formed. The silicon nitride layer which is exposed is etched away to expose the underlying silicon oxide layer. First ions are implanted into the semiconductor substrate through the silicon oxide layer within the opening. A dielectric film is deposited over the substrate. The dielectric film is planarized to the height of the silicon nitride layer. The silicon nitride layer is removed. Second ions are implanted into the semiconductor substrate where it is not covered by the dielectric film. The dielectric film is removed. The first ions are driven in to form the N-well within the semiconductor substrate and the second ions are driven in to form a P-well within the semiconductor substrate completing the formation of the twin wells in the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
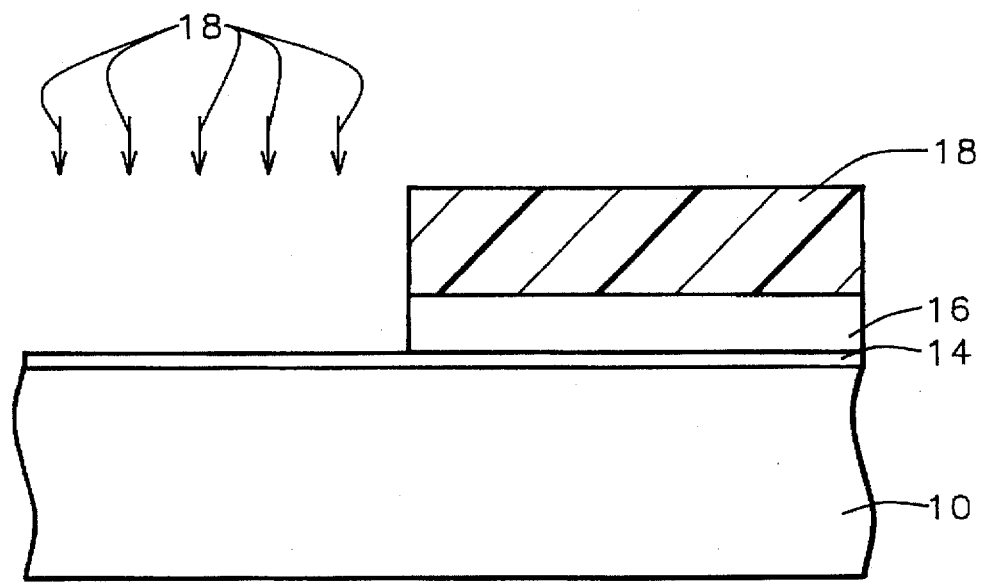
FIGS. 1 through 6 schematically illustrate in cross-sectional representation a preferred embodiment of the present invention.

Referring now more particularly to FIG. 1, there is shown an illustration of a portion of a partially completed integrated circuit. The semiconductor substrate 10 is preferably composed of silicon having a (100) crystallographic orientation. The surface of the silicon substrate 10 is thermally oxidized to form the silicon oxide layer 14 having a thickness of between about 100 to 500 Angstroms.

A layer of silicon nitride 16 is deposited over the silicon oxide layer. This layer has a thickness of between about 2000 to 5000 Angstroms.

A layer of photoresist is coated over the surface of the substrate and patterned to form the photoresist mask 18 having an opening where the N-well is to be formed. The silicon nitride layer exposed within the opening is etched away using a conventional plasma etch.

Figure 2:
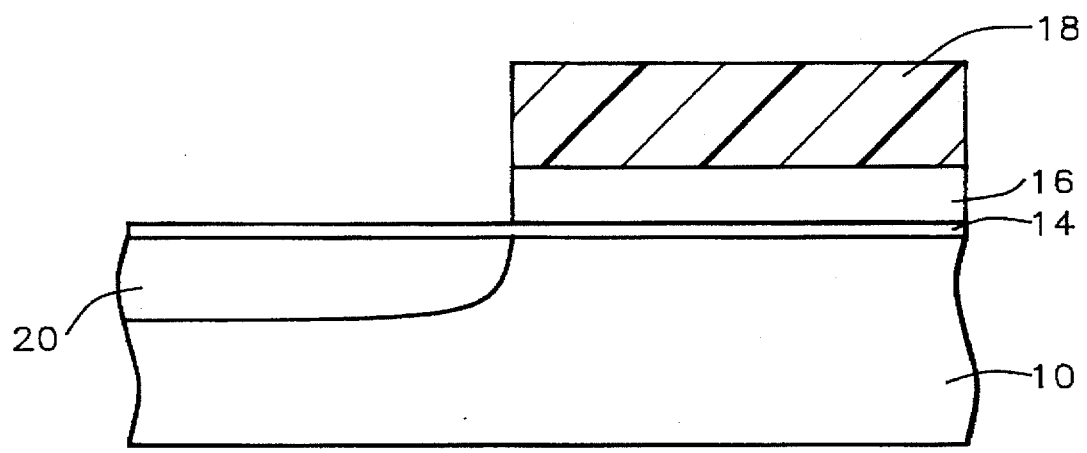

Ions 19 are implanted through the opening in the photoresist mask to form the N-well 20, as shown in FIG. 2. Typically, phosphorus ions are implanted with a dosage of between about 1 E 12 to 5 E 13 atoms/cm$^2$ at an energy of between about 50 to 800 KeV. The photoresist is stripped off using a conventional photoresist strip.

Figure 3:
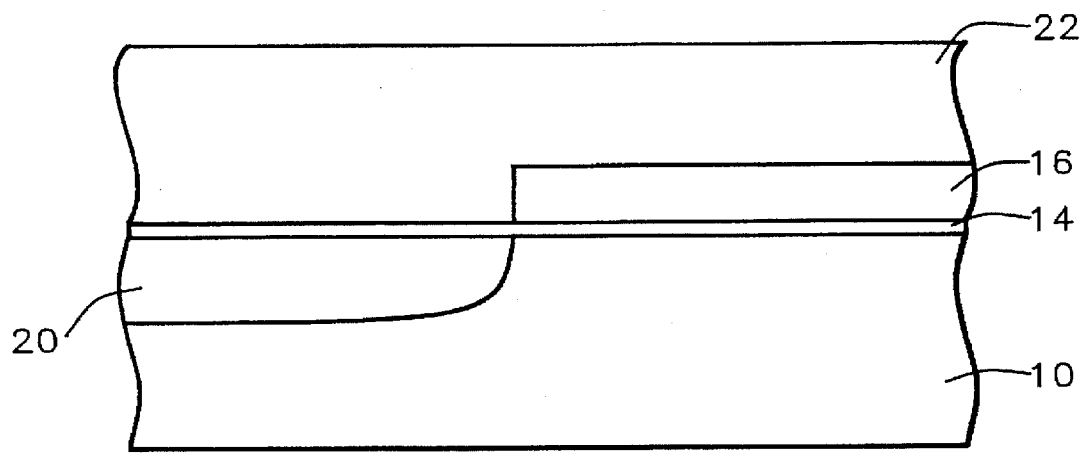

The key feature of the present invention is the use of an implant blocking layer rather than an additional photoresist mask. This implant blocking layer is not thermally grown as in the prior art. Thermal oxidation consumes a portion of the silicon substrate with the effect that the N- and P- wells would not be coplanar. The implant blocking layer of the present invention is not thermally grown, but is deposited. Therefore, no silicon substrate will be consumed and the N- and P- wells will be coplanar. Referring now to FIG. 3, a layer of oxide 22, such as tetraethoxysilane (TEOS) is deposited over the N-well and the silicon nitride layer 16. Alternatively, an organic polymer or spin-on-glass material is spun onto the wafer and cured to form layer 22. The layer 22 as deposited or spun on has a thickness of between about 3000 to 15,000 Angstroms.

Figure 4:
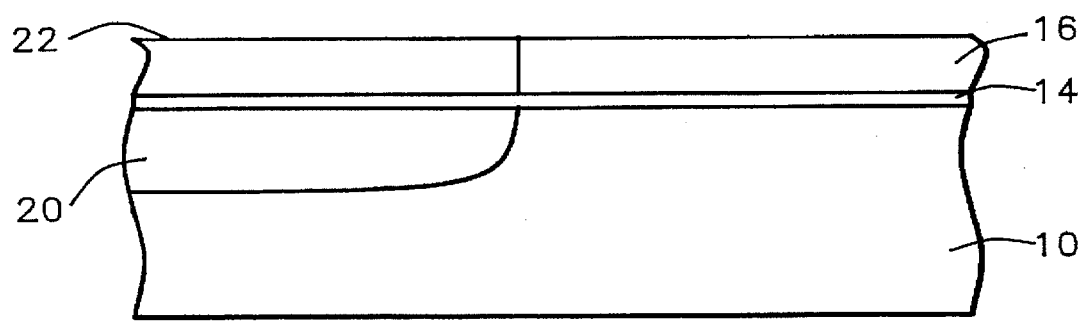

The dielectric film 22 is etched back with an etch stop at the silicon nitride film 16, as shown in FIG. 4. Alternatively, the dielectric film 22 is polished by chemical mechanical polishing (CMP). The resulting dielectric film 22 will have a thickness of between about 1500 to 5000 Angstroms.

Figure 5:
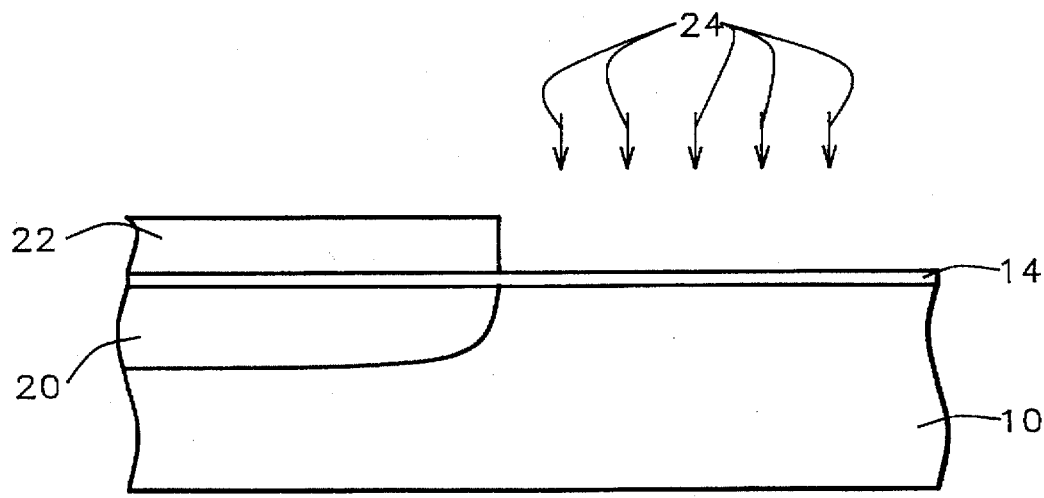
Figure 6:
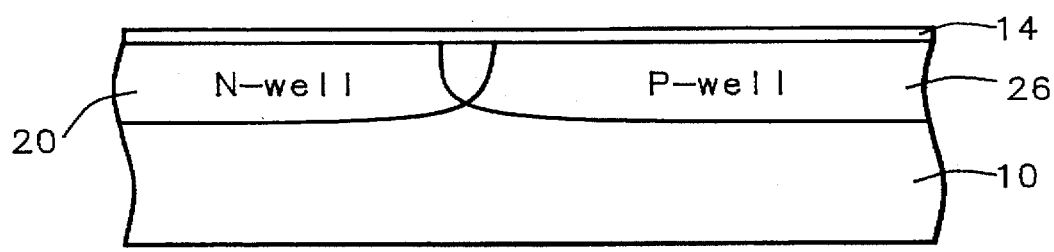

The silicon nitride film is now stripped, as shown in FIG. 5. Ions 24 are implanted to form the P-well. Typically, boron ions are implanted with a dosage of between about 1 E 12 to 5 bE 13 atoms/cm$^2$ at an energy of between about 50 to 500 KeV.

The oxide or organic polymer 22 is stripped, for example, using a hydrofluoric acid dip or other wet chemical process. The ions are driven in at this time, or during a later high temperature step, to form N-well 20 and P-well 26.

The process of the present invention results in the formation of twin wells having no height difference. Only a single masking step is required.

Figure 7:
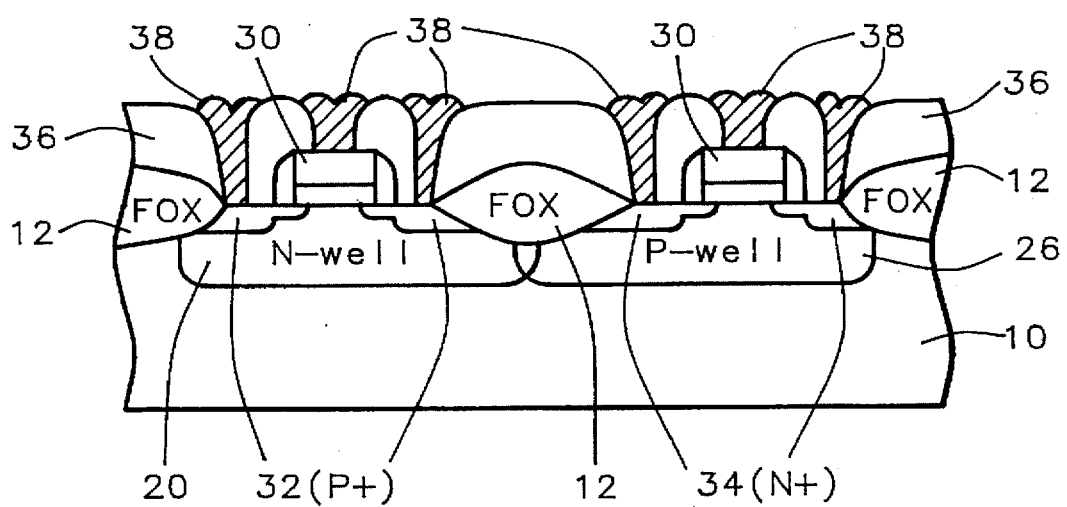
FIG. 7 schematically illustrates in cross-sectional representation a completed integrated circuit device fabricated by the process of the present invention.

Processing continues as is conventional in the art to form semiconductor device structures in and on the N- and P-wells. An example of a completed integrated circuit device made using the twin-well process of the present invention is illustrated in FIG. 7. FIeld oxide regions 12 are grown in and on the semiconductor substrate 10. Gate electrodes 30 are fabricated in the active areas above the N- and P- wells 20 and 26, respectively. P– and P+ source and drain regions 32 are formed adjacent to the gate electrode in the N- well region. N– and N+ source and drain regions 34 are formed adjacent to the gate electrode in the P- well region. A thick insulating layer 36 is deposited overlying the gate electrodes 30. Openings are made through the insulating layer 36 to the underlying gate electrodes and source and drain regions where electrical contacts are to be made. A conducting layer 38 is deposited within the contact openings and patterned to complete the electrical connections of the integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method of forming twin wells in the fabrication of an integrated circuit device comprising:

growing a layer of silicon oxide over the surface of a semiconductor substrate;

depositing a layer of silicon nitride overlying said silicon oxide layer;

coating a layer of photoresist over said silicon nitride layer;

exposing said photoresist layer to actinic light and exposing and developing said photoresist layer to form a photoresist mask having an opening to said silicon nitride layer where an N-well is to be formed;

etching away said exposed silicon nitride layer to expose said underlying silicon oxide layer;

implanting first ions into said semiconductor substrate through said silicon oxide layer within said opening;

thereafter removing said photoresist layer;

depositing a dielectric film over said exposed silicon oxide layer and over said silicon nitride layer;

planarizing said dielectric film to the height of said silicon nitride layer;

thereafter removing said silicon nitride layer;

implanting second ions into said semiconductor substrate where it is not covered by said dielectric film;

thereafter removing said dielectric film; and driving in said first ions to form said N-well within said semiconductor substrate and driving in said second ions to form a P-well within said semiconductor substrate completing the formation of said twin wells in the fabrication of said integrated circuit device.

2. The method according to claim 1 wherein said silicon oxide layer has a thickness of between about 100 to 500 Angstroms.

3. The method according to claim 1 wherein said silicon nitride layer has a thickness of between about 2000 to 5000 Angstroms.

4. The method according to claim 1 wherein said first ions are phosphorus ions implanted at a dosage of between about 1 E 12 to 5 E 13 atoms/cm$^2$ and an energy of between about 50 to 800 KeV.

5. The method according to claim 1 wherein said dielectric film comprises tetraethoxysilane (TEOS).

6. The method according to claim 1 wherein said dielectric film comprises a silane-based oxide.

7. The method according to claim 1 wherein said dielectric film comprises an organic polymer.

8. The method according to claim 1 wherein said dielectric film is deposited at a temperature of between about 200° to 800° C. to a thickness of between about 3000 to 15,000 Angstroms.

9. The method according to claim 1 wherein said dielectric film comprises a spin-on-glass material and wherein said dielectric film is deposited by spin coating and is cured.

10. The method according to claim 1 wherein said planarizing is done by etching back said dielectric film using a plasma etch with an etch stop at said silicon nitride layer.

11. The method according to claim 1 wherein said planarizing is done chemical mechanical polishing.

12. The method according to claim 1 wherein after said planarizing said dielectric film has a thickness of between about 1500 to 5000 Angstroms.

13. The method according to claim 1 wherein said second ions are boron ions implanted at a dosage of between about 1 E 12 to 5 E 13 atoms/cm$^2$ and an energy of between about 50 to 500 KeV.

14. A method of forming twin wells without height difference in the fabrication of an integrated circuit device comprising:

growing a layer of silicon oxide over the surface of a semiconductor substrate;

depositing a layer of silicon nitride overlying said silicon oxide layer;

coating a layer of photoresist over said silicon nitride layer;

exposing said photoresist layer to actinic light and exposing and developing said photoresist layer to form a photoresist mask having an opening to said silicon nitride layer where an N-well is to be formed;

etching away said exposed silicon nitride layer to expose said underlying silicon oxide layer;

implanting first ions into said semiconductor substrate through said silicon oxide layer within said opening;

thereafter removing said photoresist layer;

depositing a dielectric film over said exposed silicon oxide layer and over said silicon nitride layer;

etching back said dielectric film with an etch stop at said silicon nitride layer;

thereafter removing said silicon nitride layer;

implanting second ions into said semiconductor substrate where it is not covered by said dielectric film;

thereafter removing said dielectric film; and driving in said first ions to form said N-well within said semiconductor substrate and driving in said second ions to form a P-well within said semiconductor substrate completing the formation of said twin wells without height difference in the fabrication of said integrated circuit device.

15. The method according to claim 14 wherein said dielectric film comprises tetraethoxysilane (TEOS).

16. The method according to claim 14 wherein said dielectric film comprises a silane-based oxide.

17. The method according to claim 14 wherein said dielectric film comprises an organic polymer.

18. The method according to claim 14 wherein said dielectric film comprises a spin-on-glass material and wherein said dielectric film is deposited by spin coating and is cured.

19. A method of forming twin wells without height difference in the fabrication of an integrated circuit device comprising:

growing a layer of silicon oxide over the surface of a semiconductor substrate;

depositing a layer of silicon nitride overlying said silicon oxide layer;

coating a layer of photoresist over said silicon nitride layer;

exposing said photoresist layer to actinic light and exposing and developing said photoresist layer to form a photoresist mask having an opening to said silicon nitride layer where an N-well is to be formed;

etching away said exposed silicon nitride layer to expose said underlying silicon oxide layer;

implanting first ions into said semiconductor substrate through said silicon oxide layer within said opening;

thereafter removing said photoresist layer;

depositing a dielectric film over said exposed silicon oxide layer and over said silicon nitride layer;

planarizing said dielectric film using chemical mechanical polishing wherein said silicon nitride layer is a stop for said chemical mechanical polishing;

thereafter removing said silicon nitride layer;

implanting second ions into said semiconductor substrate where it is not covered by said dielectric film;

thereafter removing said dielectric film; and driving in said first ions to form said N-well within said semiconductor substrate and driving in said second ions to form a P-well within said semiconductor substrate completing the formation of said twin wells without height difference in the fabrication of said integrated circuit device.

20. The method according to claim 19 wherein said dielectric film comprises tetraethoxysilane (TEOS).

21. The method according to claim 19 wherein said dielectric film comprises a silane-based oxide.

22. The method according to claim 19 wherein said dielectric film comprises an organic polymer.

23. The method according to claim 19 wherein said dielectric film comprises a spin-on-glass material and wherein said dielectric film is deposited by spin coating and is cured.

* * * * *